United States Patent [19]

Cho et al.

[11] Patent Number: 4,686,111
[45] Date of Patent: Aug. 11, 1987

[54] PASSIVATED AND LOW SCATTER ACOUSTIC WAVE DEVICES AND METHOD THEREOF

[75] Inventors: Frederick Y. Cho, Scottsdale; Fred S. Hickernell, Phoenix, both of Ariz.

[73] Assignee: Motorola, Inc., Schaumburg, Ill.

[21] Appl. No.: 579,916

[22] Filed: Feb. 13, 1984

Related U.S. Application Data

[62] Division of Ser. No. 382,758, May 27, 1982, Pat. No. 4,450,374.

[51] Int. Cl.⁴ .............................................. B05D 5/12
[52] U.S. Cl. ...................................... 427/38; 427/100
[58] Field of Search ................ 310/313 B; 427/38, 39

[56] References Cited

U.S. PATENT DOCUMENTS 3,757,733  9/1973  Reinberg ............................ 148/187
4,232,239  11/1980  Dworsky et al. .................. 29/25.35
4,433,004  2/1984  Yonezawa et al. ................... 427/38
4,436,770  3/1984  Nishizawa et al. .................. 427/38

Primary Examiner—John H. Newsome
Attorney, Agent, or Firm—Jonathan P. Meyer; Eugene A. Parsons

[57] ABSTRACT

Passivated and low scatter acoustic wave devices comprise surface acoustic wave (SAW) and shallow bulk acoustic wave (SBAW) devices having transducers composed of oxidizable metal and layers of metal oxide on conventional acoustic wave substrates. Passivated transducers are achieved by forming a layer of oxide on an existing transducer. The method may be used to passivate a device packaged in a non-oxidizable package with oxidizable wire leads, thus combining complete protection with efficient manufacturing operations. Low scatter SAW transducers are achieved by forming the transducer and the interstitial insulating layer from a single layer of oxidizable metal by means of masking and oxidation operations.

1 Claim, 7 Drawing Figures

PASSIVATED AND LOW SCATTER ACOUSTIC WAVE DEVICES AND METHOD THEREOF

This is a division of application Ser. No. 382,758, filed May 27, 1982, now U.S. Pat. No. 4,450,374.

FIELD OF THE INVENTION

The present invention relates, in general, to improved, passivated surface acoustic wave (SAW) and shallow bulk acoustic wave (SBAW) devices. In addition, the present invention relates to an improved method of fabricating low scatter SAW devices. More particularly, the invention relates to the use of oxidizing processes to produce passivated and low scatter SAW and SBAW devices.

BACKGROUND OF THE INVENTION

Solid state acoustic wave devices, including surface acoustic wave (SAW) and shallow bulk acoustic wave (SBAW) devices, utilize metal transducers on the surface of piezoelectric crystals to interact with the various modes of wave propagation in the crystal. The relatively thin transducers are subject to chemical reactions with various atmospheric or other contaminants which may alter or destroy their usefulness.

It is known in the art that solid state acoustic devices may be hermetically sealed to prevent such corrosive degradation. In addition to being relatively costly, such a hermetically sealed container may contain matching circuits which out-gas harmful contaminants or may otherwise seal in contaminants.

Other known passivation techniques, such as the application of a thin layer of $Si_3N_4$ or glass are not generally useful for SAW and SBAW devices because the coating on the surface of the crystal produces undesirable loading of the surface. In addition, such passivation processes must be carried out prior to packaging the device and pathways must be opened in the passivation layer for bonding leads. These pathways provide an opening for etchants.

Low scatter SAW devices are known in the art for providing efficient coupling of the transducers with surface modes of the crystal while suppressing scattering of the surface waves into bulk modes of the crystal. In the prior art, low scatter transducers are formed by depositing an insulating material between the previously formed fingers of the inter-digital transducer. This method leaves gaps between the insulating filler and the electrode fingers, thus reducing effectiveness.

SUMMARY OF THE INVENTION

Accordingly it is an object of the present invention to provide improved passivated SAW and SBAW devices.

It is a further object of the present invention to provide a method of passivation for SAW and SBAW devices which protects the transducers and the wire leads and which may be applied to a packaged device.

Yet another object of the present invention is to provide an improved method of fabricating low scatter SAW devices.

An embodiment of the present invention comprises a SAW device packaged in a gold lead frame or other package and having aluminum transducers and wire leads. The entire package has been placed in an oxygen plasma for a predetermined period of time, thereby cleaning the package of organic or other contaminants and forming an $Al_2O_3$ layer on the transducers and wire leads while leaving the gold package and the piezoelectric crystal substantially unchanged. The layer of oxide is of sufficient thickness to provide protection from anticipated levels of contamination and does not require openings for the wire leads. In addition, this passivation method does not load the crystal surface. The transducers and leads also have increased protection from high voltage arcing by this passivation method. It is found that the mass of the oxide layer is controllable with sufficient precision to allow fine frequency tuning of the transducers or fine control over delay time by means of loading devices. This passivation method is equally well suited to SBAW devices.

Another embodiment of the present invention comprises a low scatter SAW device in which the aluminum transducers and the interstitial insulator layer are formed from a single layer of aluminum. The fabrication process involves selectively exposing portions of the aluminum layer to an oxygen plasma, thus forming the transducer fingers and interstitial insulator in monolithic form which has no gaps or other deformations. In addition to the improved structural aspects this method of fabricating low scatter transducers is substantially less expensive than prior art methods.

These and other objects and advantages of the present invention will be apparent to those skilled in the art from the detailed description below taken together with the drawings.

DETAILED DESCRIPTION OF THE INVENTION

Figure 1:
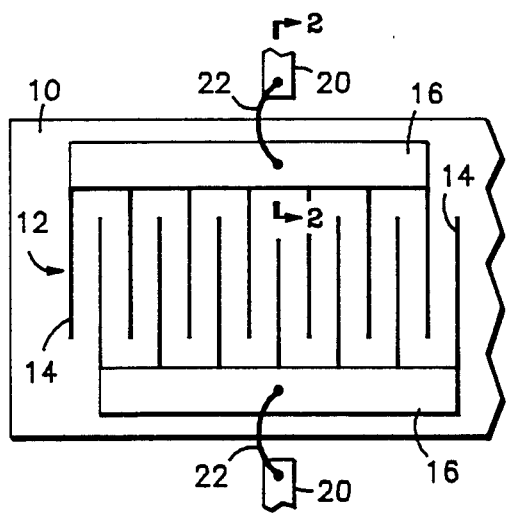
FIG. 1 is a top plan view of a portion of a packaged SAW device.

Referring to FIG. 1, a SAW device is shown in top plan view. A substrate 10, such as a quartz crystal, is chosen according to well-known principles as being suitable for the propagation of surface acoustic waves. A conductive transducer 12 is fabricated on a surface of substrate 10. Transducer 12 comprises a plurality of interdigital fingers 14 and a pair of bars 16 for interconnecting fingers 14. The design of transducer 12 may vary substantially from that shown here, as is well known. Electrical signals are communicated to transducer 12 by means of a lead frame or other type of package represented here by tabs 20. Wire leads 22 provide a connection between tabs 20 and interconnection bars 16, as shown. Atmospheric or other contaminants may react chemically with the various portions of transducer 12 and wire leads 22, thus altering the characteristics of the device or destroying it completely. Since the propagation characteristics of the surface acoustic waves on substrate 10 are effected by constraints on the surface of substrate 10, it is desirable that any method for passivating transducer 12 and wire leads 22 leaves substrate 10 substantially uneffected. It is also desirable to utilize a passivation process after interconnection bars 16 have been connected to tabs 20 by means of wire leads 22. This will obviate the need to provide holes in a passivation layer in order to make these interconnections. Such holes in a passivation layer will provide a pathway for etchants for other contaminants to reach transducer 12.

Figure 2:
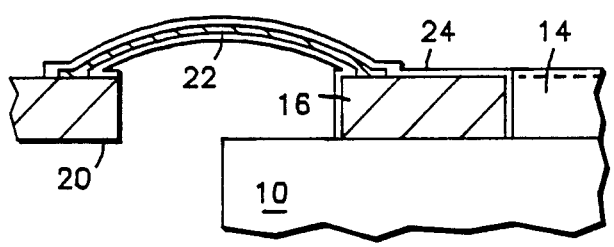
FIG. 2 is an enlarged, cross-sectional view of the SAW device of FIG. 1, along the line 2—2, which has been passivated according to the principles of the present invention.

FIG. 2 is a cross section of a portion of the SAW device of FIG. 1 along the line 2—2 in FIG. 1 on an enlarged scale. As before, interconnection bar 16 and transducer finger 14 are on the surface of substrate 10 and interconnection bar 16 is connected to tab 20 by means of a wire lead 22. A passivation layer 24 completely covers wire lead 22, interconnection bar 16 and transducer finger 14, while leaving the surface of substrate 10 and tab 20 substantially uneffected. Transducer 12 and wire lead 22 are composed of an oxidizable metal such as aluminum. Tab 20 is composed of a substantially non-oxidizable metal such as gold. Passivation layer 24 is composed of, for instance, aluminum oxide. Layer 24 may be formed, for instance, by placing the entire package in an oxygen plasma for a predetermined length of time. The oxygen plasma causes the formation of passivation layer 24 by oxidizing the underlying metal. In addition, the oxygen plasma assists in cleaning the entire device of organic contaminants. As is well known in the art, transducer 12 and wire lead 22 will have a thin layer of aluminum oxide thereon after having been exposed to the air. This natural oxide layer is found to be approximately 50 to 60 Angstroms in thickness and does not provide significant protection from etchants. However, passivation layer 24 is greater than 60 Angstroms and may be as much as several hundred Angstroms in thickness, thus providing significant protection from etchants. In addition, gold lead frame and substrate 10 will be substantially uneffected by the oxygen plasma. This avoids undesirable effects on the propagation characteristics of substrate 10 and allows the passivation process to take place subsequent to packaging the SAW device, thus obviating the need to create holes in passivation layer 24 to make the necessary connections.

Figure 3:
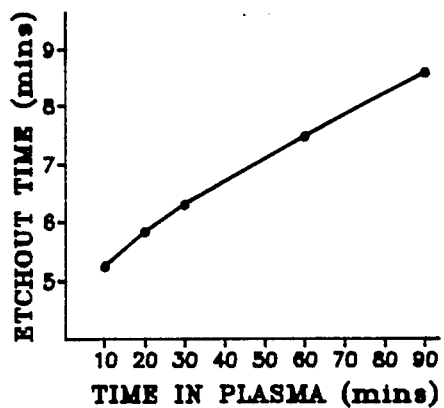
FIG. 3 is a graph of the time required to etch away a 500 Angstrom thick transducer as a function of the length of exposure to an oxygen plasma.

Referring now to FIG. 3, the parameters of the passivation process are described. FIG. 3 is a graph showing the time required to completely etch away 500 Angstroms of aluminum as a function of the amount of time the aluminum layer was exposed to the oxygen plasma. The etchant solution used is one of acetic acid which will etch 500 Angstroms of aluminum with only the naturally occurring oxide layer in 2 to 3 minutes. The passivation layer is created by exposing the device to an RF plasma at a pressure of 0.325 Torr and a forward power of 150 watts. It has been found that the pressure, power level and other parameters of the plasma process may be varied widely. For instance, pressures of up to 1 Torr have been successfully used. As is apparent from FIG. 3, the degree of protection from etching increases substantially with as little as 10 minutes exposure to the plasma. The degree of protection is roughly linear with respect to the time in the plasma. As will be apparent to one skilled in the art, it is to be expected that the thickness of passivation layer 24 will increase more slowly with respect to the exposure time as the greater thickness impedes further oxidation.

SBAW devices, which utilize substantially identical transducers, but which generate acoustic waves traveling beneath the surface of the substrate, may be passivated by the same process described above. In addition, this passivation process may be used in combination with hermetic sealing to decrease the effect of sealed-in contaminants. It is also found that the present invention allows sufficient control over the mass of material deposited on the interdigital fingers of a transducer to make possible fine tuning of a transducer in the frequency domain. As is well known in the art, the mass of the interdigital fingers of a SAW transducer effects the frequency of operation of the device, so a method of fine adjustment of the mass of the fingers subsequent to fabrication allows fine adjustment of frequency. In this way, a large number of SAW or SBAW devices may be fabricated to very close frequency tolerances by adjusting the frequency of each device after fabrication. In addition, it would be possible to alter the mass of a loading device such as an aluminum plate over the path of the surface waves by carefully controlled oxidation, thereby adjusting the delay of the device. Finally, an acoustic wave device passivated according to the principles of the present invention has increased protection from electrical arcing due to high voltage transients.

Figure 4A:
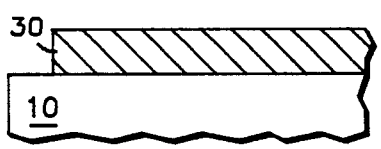
FIGS. 4A, 4B, 4C and 4D are cross-sectional views of a portion of a low scatter SAW transducer illustrating steps in the fabrication thereof.
Figure 4B:
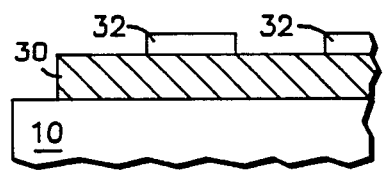
Figure 4C:
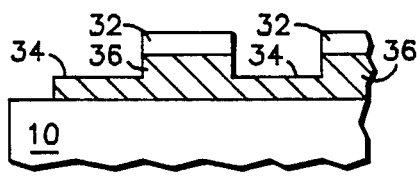
Figure 4D:
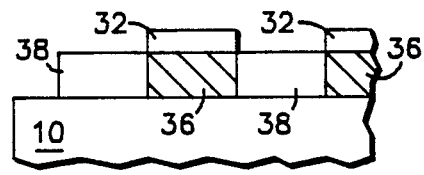

Another aspect of the present invention is described with reference to FIGS. 4A, 4B and 4C, which illustrate the steps in process of fabricating low scatter SAW transducers. As is well known, the discontinuities caused by the transducer fingers in a SAW device may scatter energy in surface waves into bulk modes of the crystal, thus decreasing the energy reaching the output transducer and causing other problems. As is well known in the art, it is possible to reduce the scattering by means of an insulating layer of material which fills the gaps between the fingers of the transducer. This result has been achieved in the prior art by depositing such a layer of insulating material in a separate step subsequent to fabrication of the transducer. The present invention provides a method of fabrication of the transducer and the filler material from a single layer of oxidizable metal, thus achieving more uniformity with less processing cost. A first step in the process is illustrated in FIG. 4A. A suitable substrate 10 is chosen and a layer 30 of oxidizable metal, such as aluminum, is deposited thereon. Metal layer 30 has a uniform thickness, which may be, for example, 500 Angstroms. A second step, illustrated by FIG. 4B, comprises depositing a photoresist 32 on a first region of layer 30. As will be apparent, the region of layer 30 protected by photoresist 32 will eventually comprise a plurality of fingers 36 of the low scatter transducer. A third step in the process, illustrated by FIG. 4C, comprises exposing the device to an etchant such that the thickness of layer 30 is reduced in a second region 34 which is not protected by photoresist 32. The purpose of this step is to compensate for the fact that the oxidation process will increase the thickness of second region 34. A fourth step in the process, illustrated by FIG. 4D, comprises oxidizing the second region 34 to produce a layer of oxide 38 which is substantially the same thickness as, and fills the gaps between, transducer fingers 36. Photoresist 32 is then removed and interconnections made to provide a completed low scatter SAW transducer. As above, the oxidation process may be achieved by exposing the device to an oxygen plasma for a predetermined length of time. It is also possible that other methods of oxidation will prove useful.

While the invention has been particularly shown and described with reference to a preferred embodiment thereof, it will be understood by those skilled in the art that various other modifications and changes may be made to the present invention from the principles of the invention described above without departing from the spirit and scope thereof.

We claim:

1. A method of fabricating low-scatter surface acoustic wave devices comprising the steps of:
   depositing a layer of an oxidizable metal of a first thickness on a substrate;
   providing a protective coating on a first region of said layer, said first region comprising at least one inter-digital transducer;
   etching said layer of oxidizable metal to a second thickness less than said first thickness in a second region, said second region comprising a plurality of gaps between fingers of said at least one inter-digital transducer;
   completely oxidizing said layer of metal in said second region, whereby a layer of oxide is formed of approximately said first thickness; and
   removing said protective coating from said layer of oxidizable metal in said first region.

* * * * *